United States Patent
Murakami

(10) Patent No.: US 10,418,418 B2
(45) Date of Patent: Sep. 17, 2019

(54) STORAGE DEVICE AND PRODUCTION METHOD THEREOF

(71) Applicant: TOSHIBA MEMORY CORPORATION, Minato-ku, Tokyo (JP)

(72) Inventor: Yosuke Murakami, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/696,122

(22) Filed: Sep. 5, 2017

(65) Prior Publication Data

US 2018/0269256 A1 Sep. 20, 2018

(30) Foreign Application Priority Data

Mar. 16, 2017 (JP) ................. 2017-051357

(51) Int. Cl.
*H01L 27/24* (2006.01)
*H01L 45/00* (2006.01)

(52) U.S. Cl.
CPC ........ *H01L 27/249* (2013.01); *H01L 27/2454* (2013.01); *H01L 45/1226* (2013.01); *H01L 45/1683* (2013.01); *H01L 45/06* (2013.01); *H01L 45/08* (2013.01); *H01L 45/144* (2013.01); *H01L 45/145* (2013.01)

(58) Field of Classification Search
CPC ............... H01L 27/249; H01L 27/2454; H01L 27/10808; H01L 27/10852; H01L 27/10814; H01L 27/10817; H01L 28/90; H01L 45/1233; H01L 45/1226
See application file for complete search history.

(56) References Cited

U.S. PATENT DOCUMENTS

| | | | | |
|---|---|---|---|---|
| 8,120,006 B2* | 2/2012 | Kim | ........................ | H01L 45/04 257/296 |
| 8,299,571 B2* | 10/2012 | Ozawa | .................. | H01L 27/249 257/4 |
| 8,791,446 B2 | 7/2014 | Ishibashi | | |
| 8,912,521 B2* | 12/2014 | Nojiri | ..................... | H01L 45/16 257/2 |
| 2011/0115049 A1* | 5/2011 | Kim | ........................ | H01L 45/04 257/530 |
| 2014/0138597 A1* | 5/2014 | Nojiri | .................. | H01L 27/2454 257/2 |
| 2015/0179705 A1 | 6/2015 | Wouters et al. | | |

* cited by examiner

*Primary Examiner* — David C Spalla
(74) *Attorney, Agent, or Firm* — Foley & Lardner LLP

(57) ABSTRACT

According to one embodiment, a storage device includes a first wiring extending in a first direction, a second wiring connected to the first wiring and extending in a second direction, which crosses the first direction, a third wiring extending in a third direction, which crosses the second direction, and a first variable resistance film connected to the second wiring and the third wiring. The third wiring includes a first portion that extends in the third direction and a second portion that protrudes from a side surface of the first portion toward the second wiring and that has an end surface connected to the first variable resistance film.

15 Claims, 13 Drawing Sheets

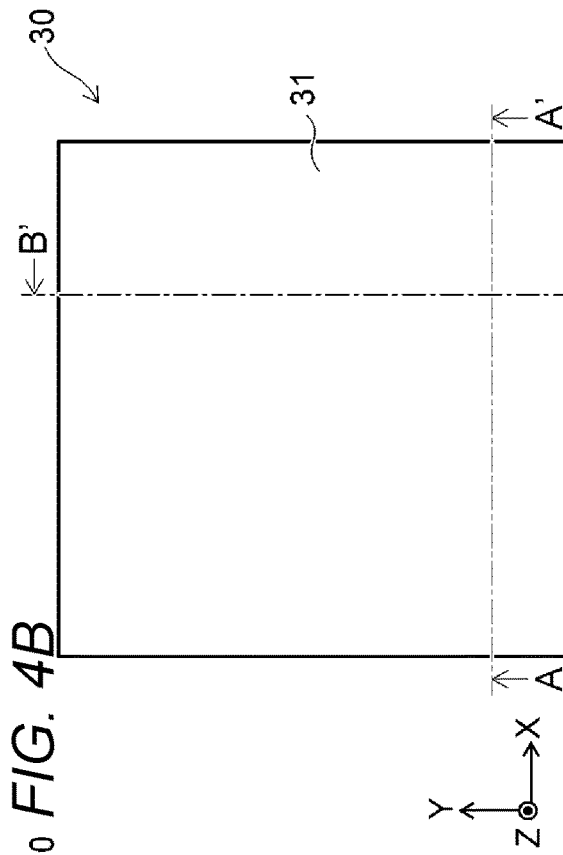
FIG. 4A
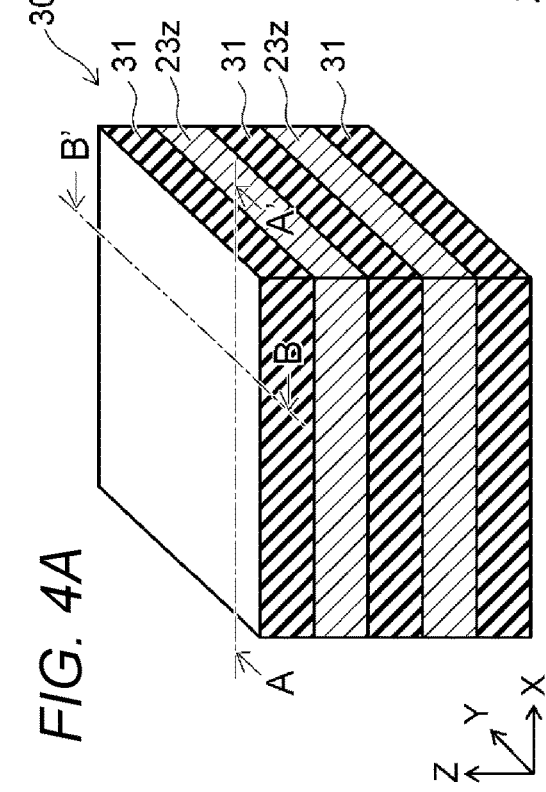
FIG. 4C
FIG. 4B
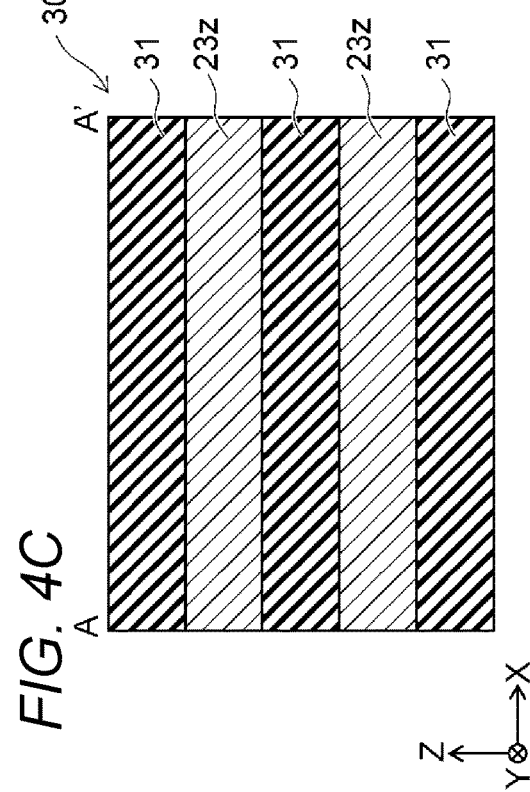
FIG. 4D

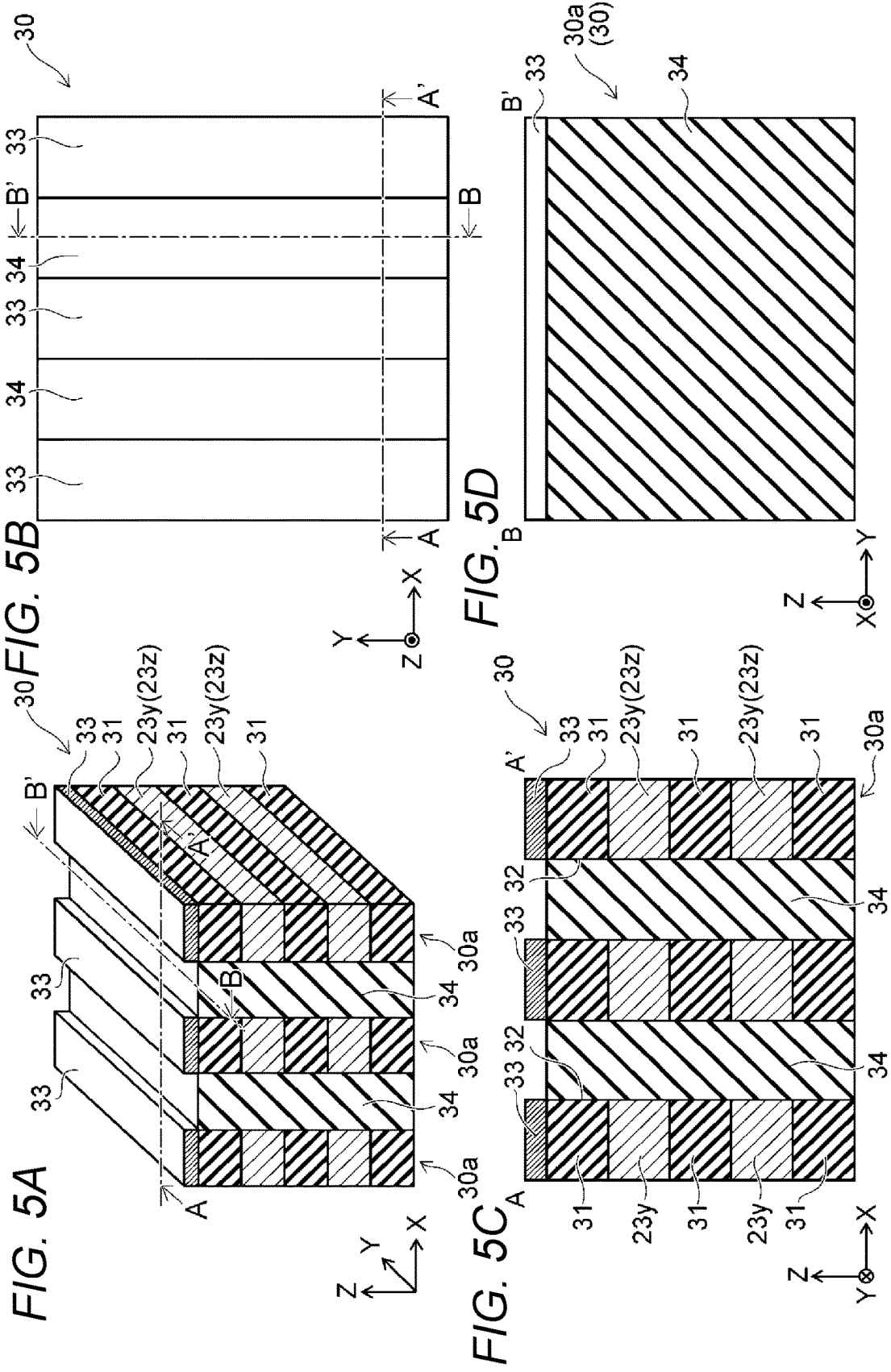

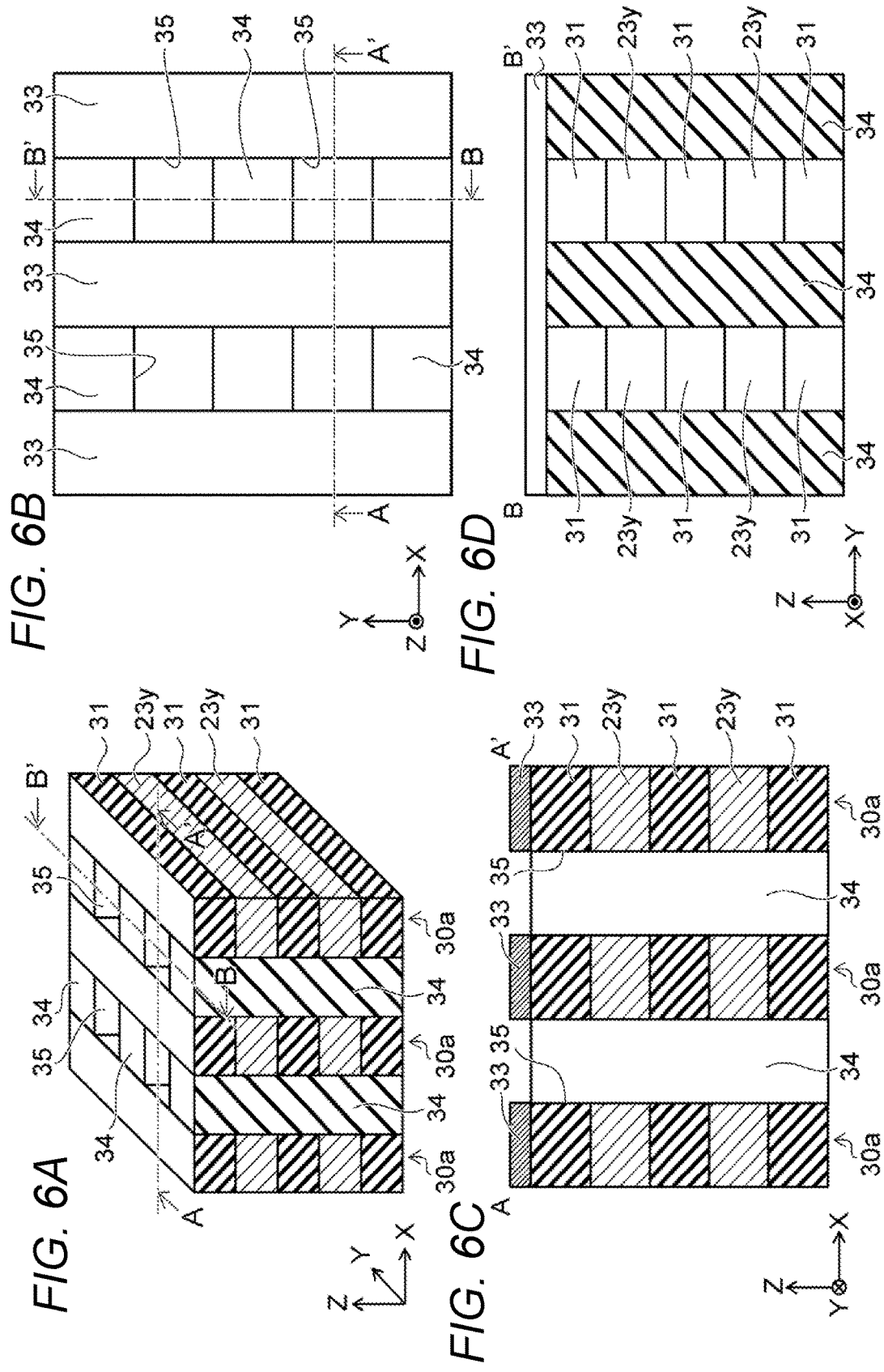

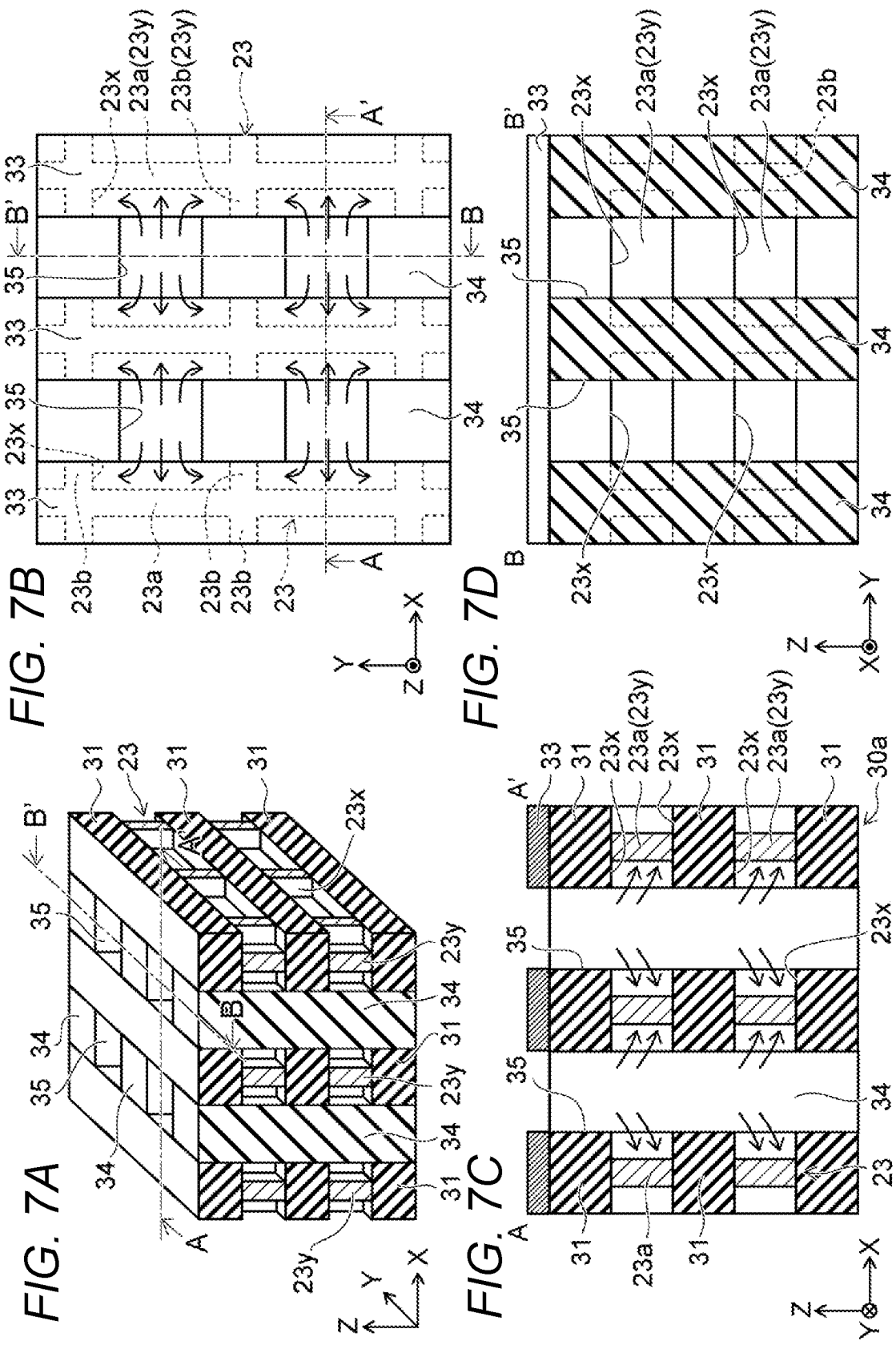

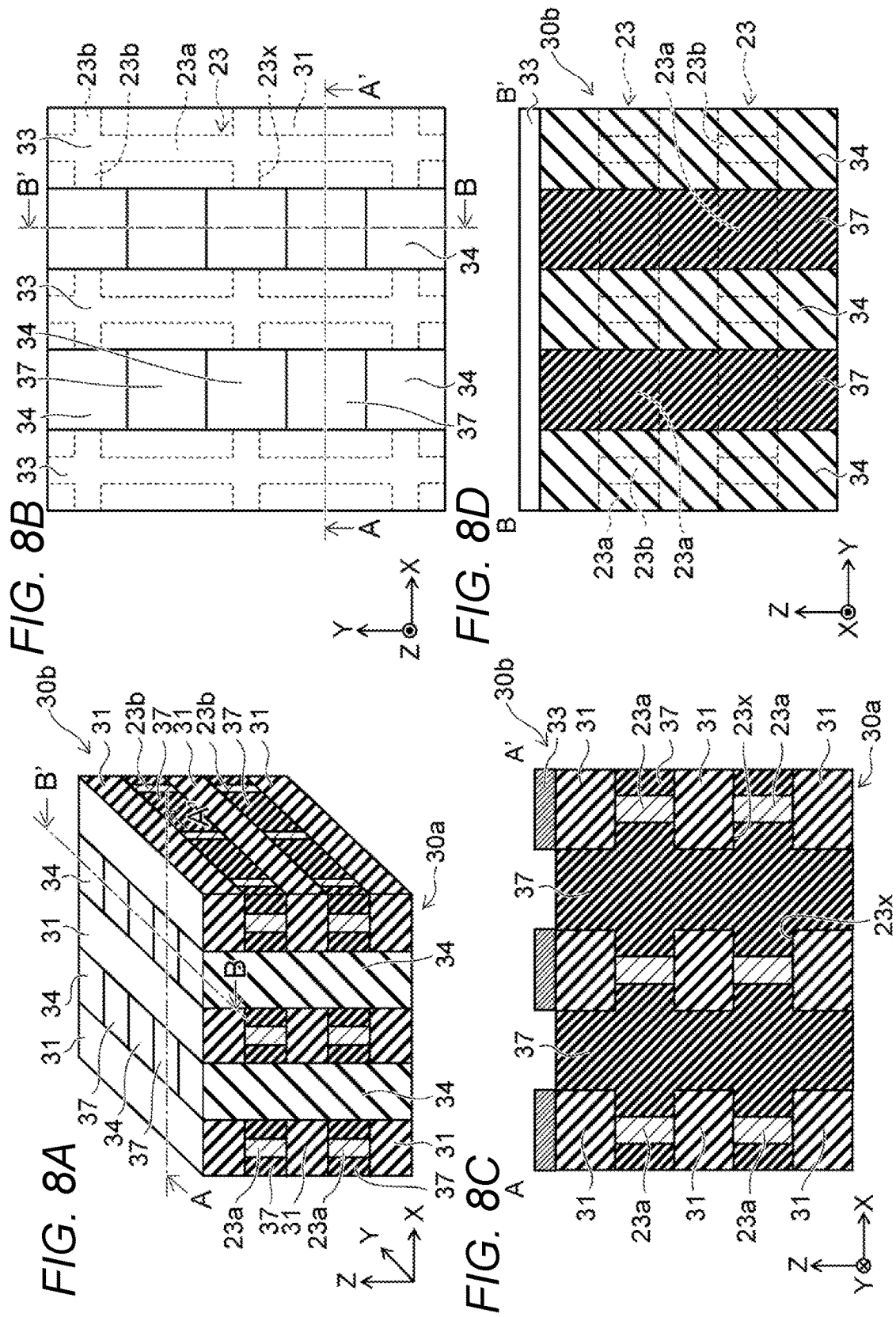

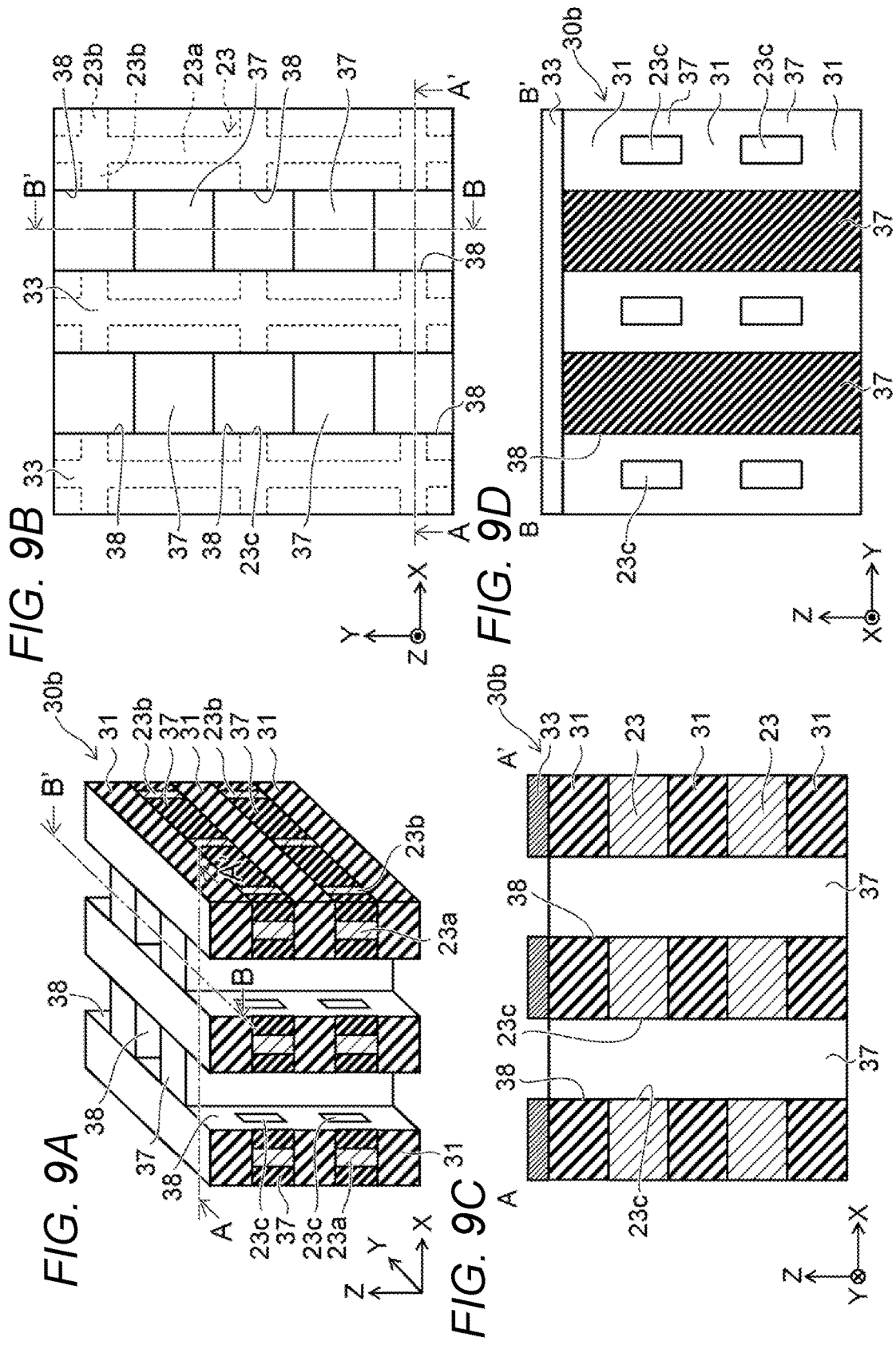

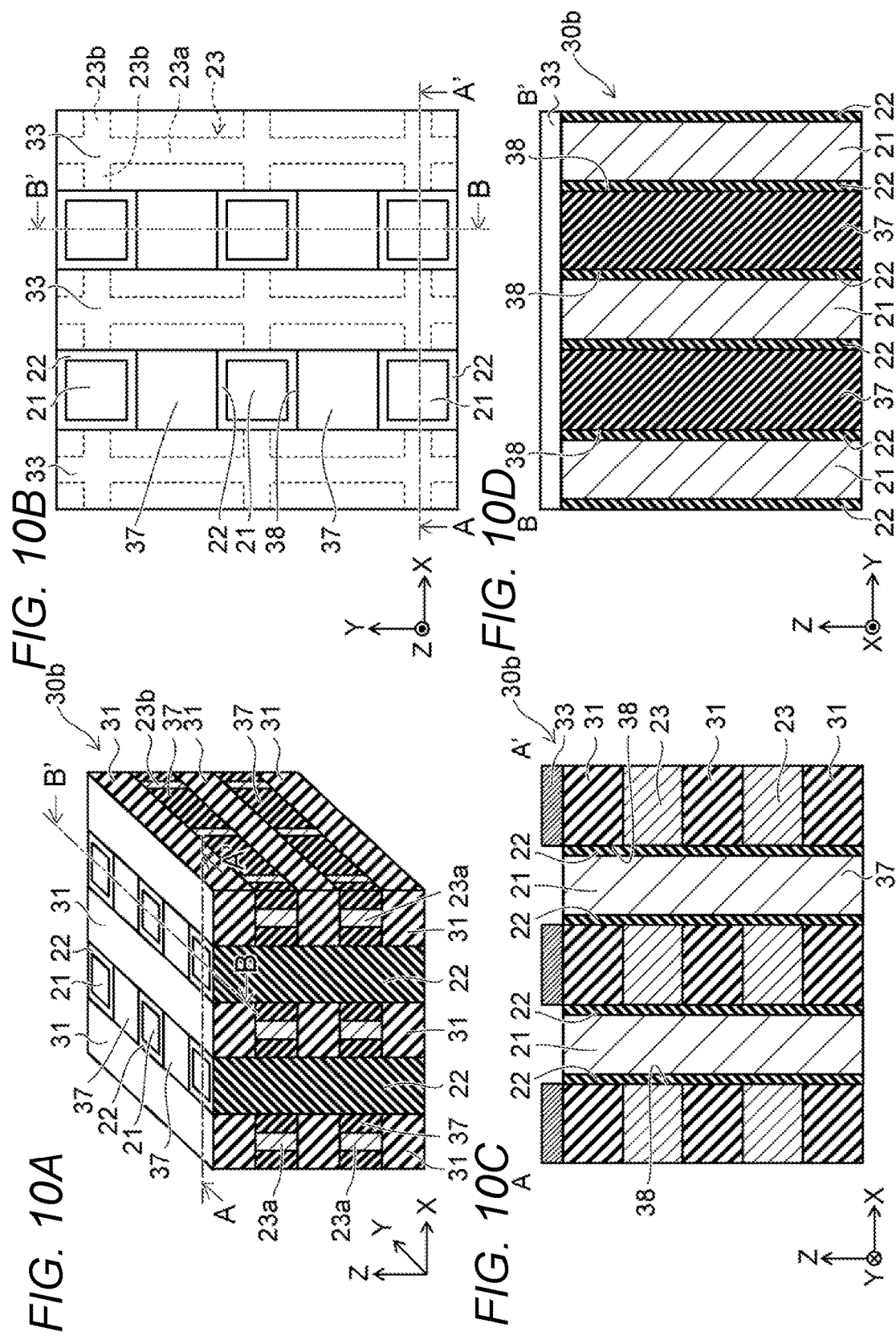

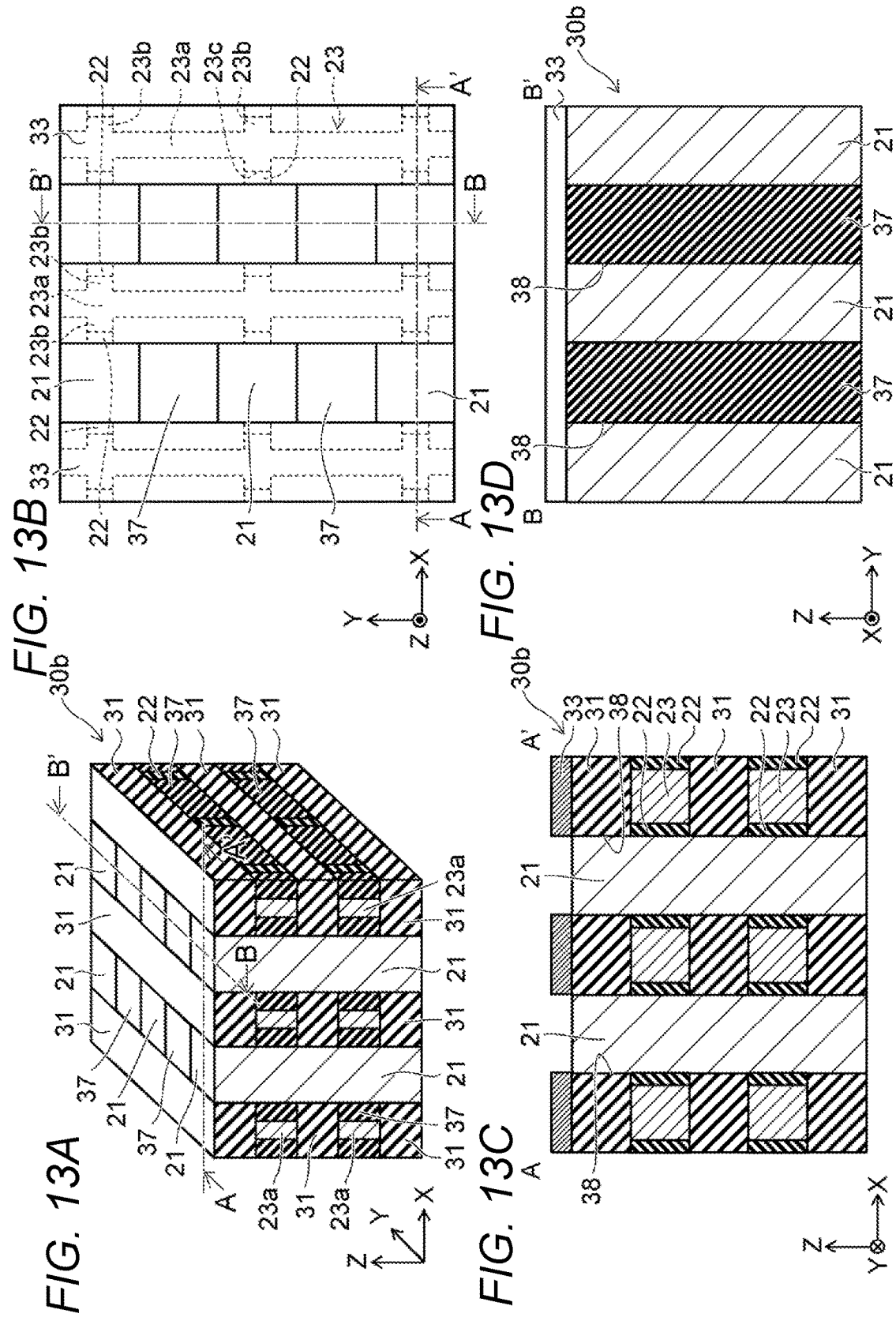

STORAGE DEVICE AND PRODUCTION METHOD THEREOF

CROSS-REFERENCE TO RELATED APPLICATION

This application claims the benefit of and priority to Japanese Patent Application No. 2017-051357, filed Mar. 16, 2017, the entire contents of which are incorporated herein by reference.

FIELD

Embodiments described herein relate generally to a storage device and a production method thereof.

BACKGROUND

Some storage devices include a variable resistance film between two types of wirings, which extend in directions orthogonal to each other. This structure allows three-dimensional integration of two-terminal memory cells and thereby allows greatly increased capacity. In some implementations, it can be advantageous to include memory cells that are respectively driven by a small amount of electric power.

DESCRIPTION OF THE DRAWINGS

FIG. 4A, FIG. 4B, FIG. 4C, and FIG. 4D are views showing one or more embodiments of a production method of the storage device according to the first aspect.

FIG. 5A, FIG. 5B, FIG. 5C, and FIG. 5D are views showing one or more embodiments of the production method of the storage device according to the first aspect.

FIG. 6A, FIG. 6B, FIG. 6C, and FIG. 6D are views showing one or more embodiments of the production method of the storage device according to the first aspect.

FIG. 7A, FIG. 7B, FIG. 7C, and FIG. 7D are views showing one or more embodiments of the production method of the storage device according to the first aspect.

FIG. 8A, FIG. 8B, FIG. 8C, and FIG. 8D are views showing one or more embodiments of the production method of the storage device according to the first aspect.

FIG. 9A, FIG. 9B, FIG. 9C, and FIG. 9D are views showing one or more embodiments of the production method of the storage device according to the first aspect.

FIG. 10A, FIG. 10B, FIG. 10C, and FIG. 10D are views showing one or more embodiments of the production method of the storage device according to the first aspect.

FIG. 13A, FIG. 13B, FIG. 13C, and FIG. 13D are views showing one or more embodiments of a production method of the storage device according to the second aspect.

DETAILED DESCRIPTION

One or more example embodiments provide for a storage device including memory cells that are driven by a small electric power and also provide for a production method of the storage device.

In one or more embodiments according to an aspect, a storage device includes a first wiring that extends in a first direction, a second wiring that connects to the first wiring and that extends in a second direction, which crosses the first direction, a third wiring that extends in a third direction, which crosses the second direction, and a first variable resistance film that is connected to the second wiring and the third wiring. The third wiring has a first portion that extends in the third direction and a second portion that protrudes from a side surface of the first portion toward the second wiring and that has an end surface connected to the first variable resistance film.

In one or more embodiments according to another aspect, a production method of a storage device includes alternately stacking first insulating films and wiring films in a first direction to form a first stacked body, forming trenches in the first stacked body that extend in the first direction and in a second direction crossing the first direction to divide the wiring films into a plurality of wiring members, and forming a respective first insulating member in each of the trenches. The method also includes forming multiple first holes in each of the first insulating members arrayed along the second direction such that the first holes each expose at least one of the wiring members, forming one or more first recesses in each of the wiring members using the first holes, and forming a respective second insulating member in the first recesses and in the first holes. The method further includes forming second holes defined in part by the second insulating members that expose portion of the respective wiring members disposed between pairs of the first recesses. The method further includes forming a variable resistance film on a side surface of each of the second holes, and forming a respective first wiring in each of the second holes.

First Aspect

First, one or more embodiments according to a first aspect will be described.

Figure 1:
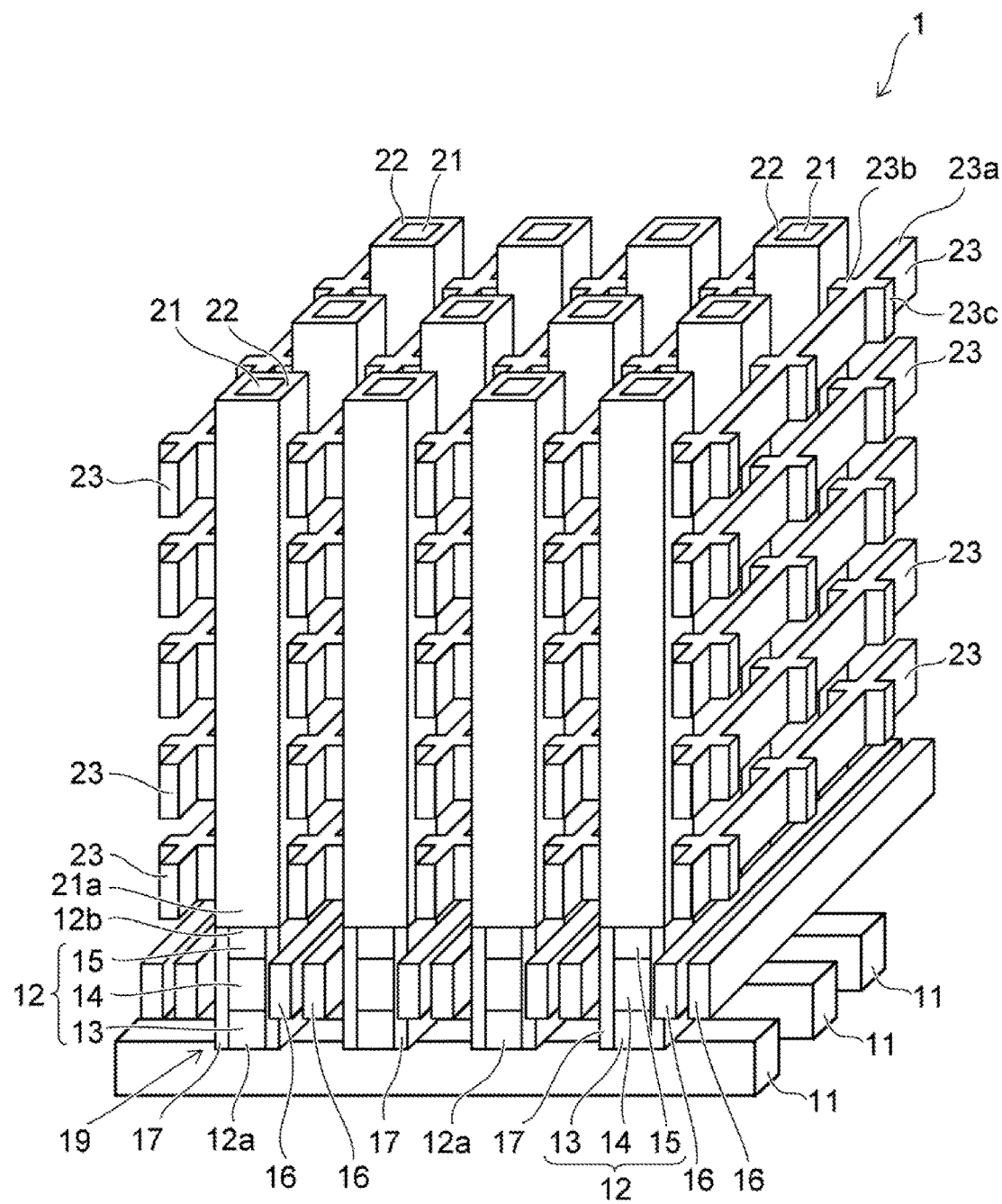
FIG. 1 is a perspective view showing one or more embodiments of a storage device according to a first aspect.

FIG. 1 is a perspective view showing one or more embodiments of a storage device according to the first aspect.

Figure 2A:
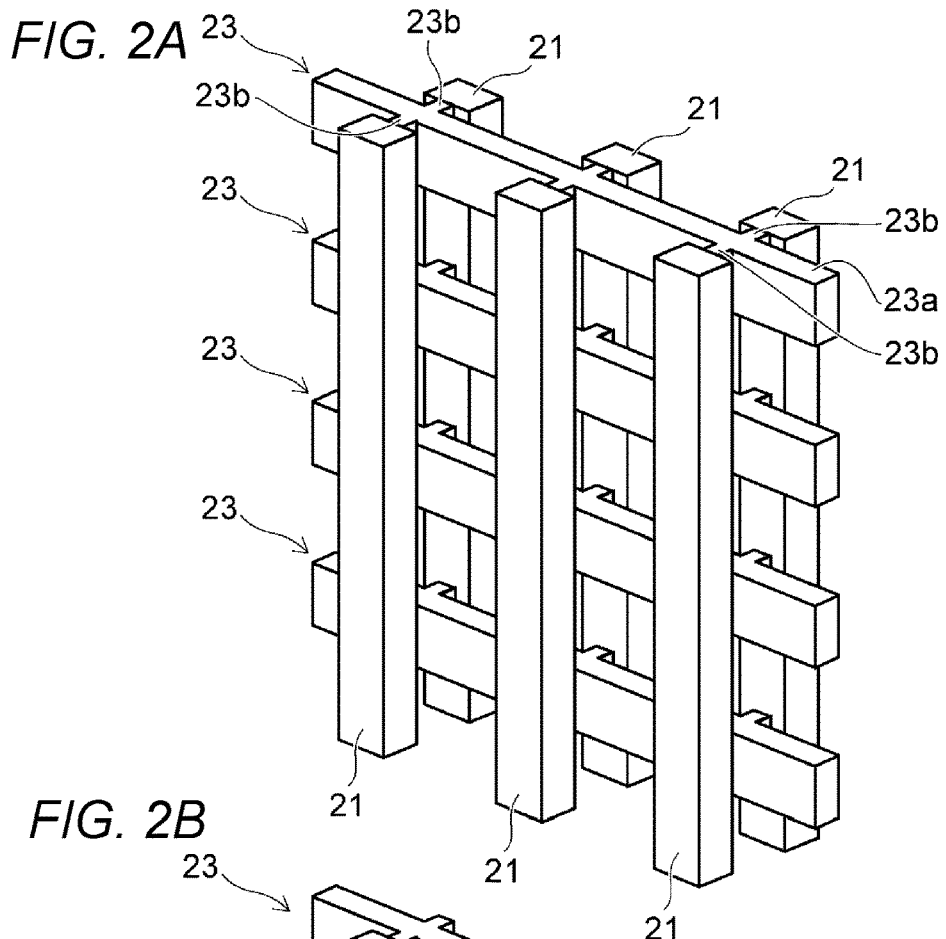
FIG. 2A is a perspective view showing a relationship between local bit lines and word lines in one or more embodiments of the storage device according to the first aspect.
Figure 2B:
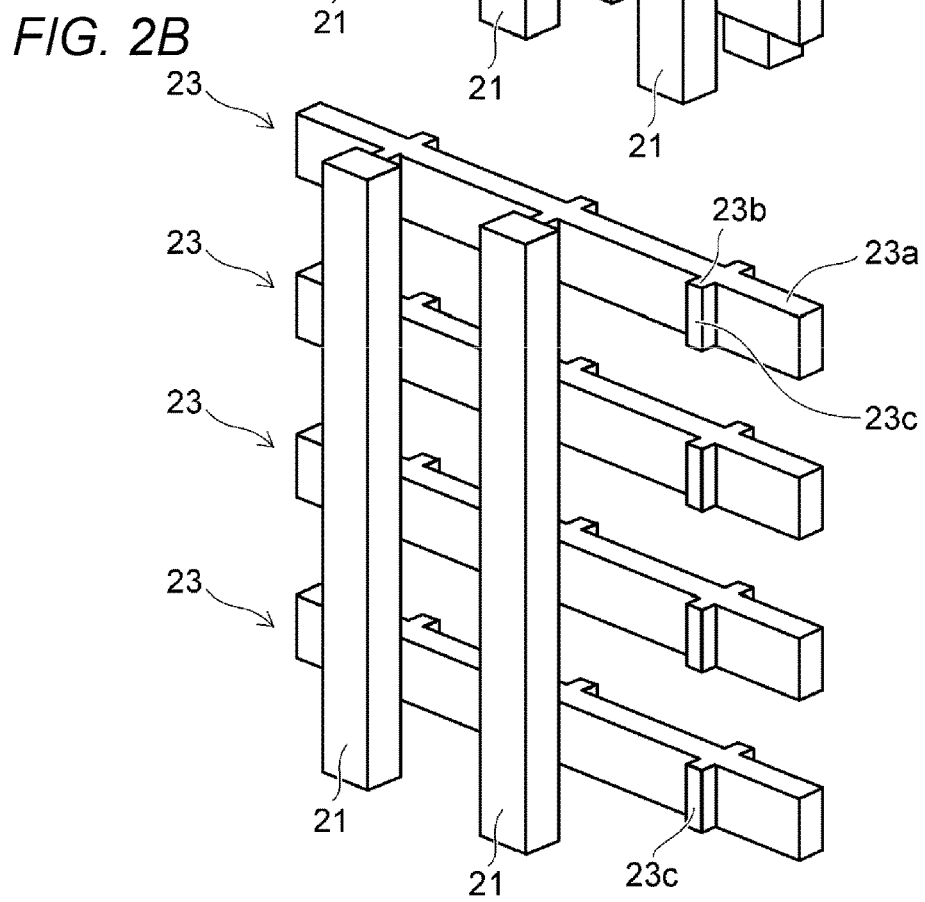
FIG. 2B is a perspective view showing cell regions of one or more embodiments of the storage device according to the first aspect.

FIG. 2A is a perspective view showing a relationship between local bit lines and word lines in the storage device according to the first aspect, and FIG. 2B is a perspective view showing cell regions of the storage device.

Figure 3:
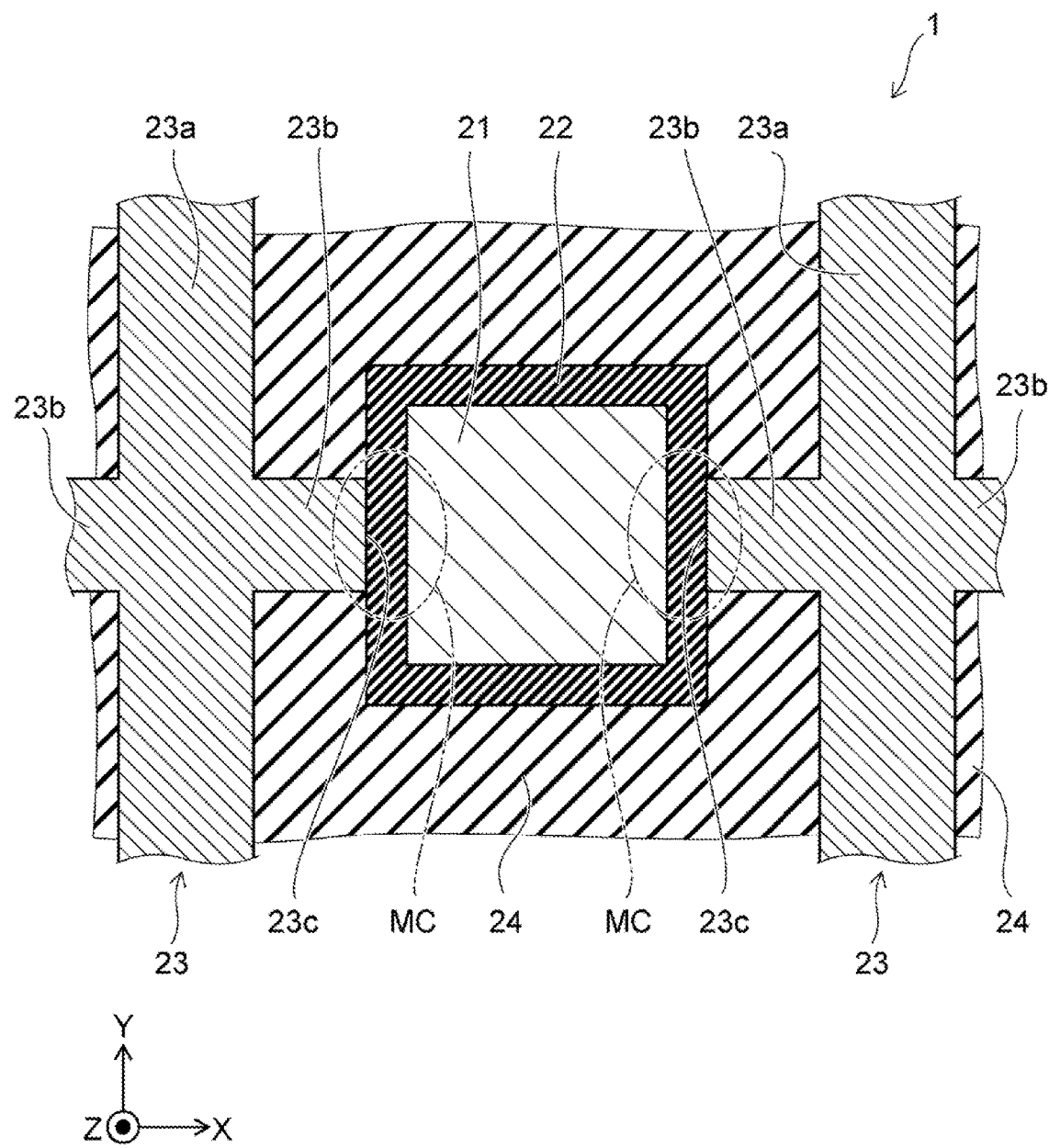
FIG. 3 is a sectional view showing memory cells of one or more embodiments of the storage device according to the first aspect.

FIG. 3 is a sectional view showing memory cells of one or more embodiments of the storage device according to the first aspect.

FIG. 1 shows a storage device 1 according to the first aspect. The storage device 1 has multiple global bit lines 11, which are, for example, formed by partitioning an upper layer part of a silicon substrate with element separating insulations (not shown), or formed by depositing polysilicon on an insulating film (not shown) formed on a silicon substrate (not shown).

Hereinafter, an XYZ orthogonal coordinate system is used in the descriptions, as shown in FIG. 1. A direction of extension of the global bit lines 11 is referred to as an "X direction", and a direction along which the global bit lines 11 are arrayed is referred to as a "Y direction". A direction orthogonal to the X direction and the Y direction is referred to as a "Z direction". The "Z direction" can refer to a +Z direction (the direction of the Z arrow shown in FIG. 1) or to a −Z direction (directed opposite to the +Z direction). While the +Z direction is sometimes referred to as an "upper direction", and the −Z direction is sometimes referred to as a "lower direction," this terminology is used for expedience and does not indicate any relationship to a direction of gravity.

Each of the global bit lines 11 has one or more silicon members 12 provided thereon. The silicon members 12 are arrayed along the X direction and the Y direction in a matrix as seen from the Z direction. Each of the silicon members 12 has, for example, a truncated quadrangular pyramid shape, in which a longitudinal direction is in the Z direction, an upper surface and a lower surface of the silicon members 12 each extend in the X direction and the Y direction to form a rectangular shape, and the upper surface is smaller than the lower surface. The silicon members 12 that are arrayed in a line along the X direction each include a lower end 12a, which are commonly connected to one global bit line 11.

Each of the silicon members 12 is configured by stacking an n+ type part 13, a p− type part 14, and an n+ type part 15 in the Z direction in this order from a lower side, that is, from the global bit line 11 side. In some embodiments, a p-type part 13, an n-type part 14, and a p-type part 15 may be implemented.

Pairs of gate electrodes 16 that extend in the Y direction are respectively disposed between each adjacent pair of silicon members 12. The gate electrodes 16 include a conductive material, such as titanium nitride (TiN) or polysilicon. The gate electrodes 16 overlap an upper portion of the n+ type part 13, the p− type part 14 (e.g. the entirety of the p− type part 14), and a lower portion of the n+ type part 15 as seen from the X direction.

The silicon member 12 and the gate electrodes 16 have agate insulating film 17 provided therebetween. The gate insulating film 17 includes silicon oxide, for example. The silicon member 12 including the n+ type part 13, the p− type part 14, and the n+ type part 15, the gate insulating films 17, and a pair of the gate electrodes 16 sandwiching the silicon member 12 constitute an n-channel thin-film transistor (TFT) 19, for example. The TFT 19 is a switching element that switches between a current conduction state and a current non-conduction state.

The silicon members 12 each have respective a local bit line 21 provided thereon. The local bit lines 21 include a conductive material, such as titanium nitride, tungsten (W), or polysilicon (Si). The local bit lines 21 extend in the Z direction and have a square pole or column shape, for example. The local bit lines 21 have a longitudinal direction in the Z direction, and have a length (extension) in the Z direction which is longer than a length in the X direction and a length the Y direction.

The local bit lines 21 each have a lower end 21a that connects (electrically and/or physically) to an upper end 12b of a corresponding silicon member 12. Each of the local bit lines 21 is disposed immediately above one of the silicon members 12, and thus, multiple local bit lines 21 are arrayed along the X direction and the Y direction in a matrix in the entirety of the storage device 1.

The local bit lines 21 each have a variable resistance film 22 provided therearound, that is, provided on each side surface facing in the X direction and each side surface facing in the Y direction. The variable resistance films 22 have a tubular shape surrounding the corresponding local bit lines 21 and have a longitudinal direction in the Z direction. The variable resistance films 22 vary their resistance condition in accordance with supplied electric voltage or supplied electric current. The variable resistance films 22 are, for example, variable phase films, and in one or more embodiments may be germanium-antimony-tellurium (GST) films. The variable resistance films 22 may also be metal oxide films that enter a low resistance state when a filament is formed inside and enter a high resistance state when the filament is disconnected.

Pairs of the local bit lines 21 that are disposed adjacent to each other in the X direction have multiple word lines 23 disposed therebetween, and the word lines 23 extend in the Y direction and are arrayed physically separate from each other in the Z direction. The word lines 23 are arrayed along the X direction and the Z direction in a matrix as seen from the Y direction. The word lines 23 include an etchable conductive material, such as tungsten or polysilicon.

As shown in FIG. 1 through FIG. 3, each of the word lines 23 includes a wiring part 23a that extends in the Y direction and multiple protrusions 23b that protrude from each side of the wiring part 23a in the X direction. The wiring part 23a and the protrusions 23b are integrally formed, for example. The protrusions 23b protrude from a side surface of the wiring part 23a toward one or more of the corresponding local bit lines 21. A side surface of the wiring part 23a is an area facing in the X direction. The side surface of the wiring part 23a is approximately parallel to a YZ plane. The protrusions 23b have an approximately rectangular parallelepiped shape and each have an end surface 23c, which faces one of the corresponding local bit lines 21 and has an approximately rectangular shape. The end surface 23c has a length in the Z direction, which is approximately the same as the length in the Z direction of the wiring part 23a. The end surface 23c has a length in the Y direction, which is shorter than the length in the Y direction of the local bit line 21.

Each of the variable resistance films 22 connects the local bit line 21 and the word lines 23 that are arrayed in the Z direction. Among the surfaces of the word lines 23, the end surfaces 23c of the protrusions 23b selectively contact the variable resistance films 22, and other areas such as side surfaces of the protrusions 23b do not contact the variable resistance films 22. Also, the local bit lines 21 contact corresponding variable resistance films 22 (e.g. variable resistance films 22 that surround the local bit lines 21), respectively. It is noted that the variable resistance films 22 are not shown in FIG. 2A and FIG. 2B to simplify the drawings.

As shown in FIG. 3, a memory cell MC is constituted at each intersection between the local bit line 21 and the word line 23 via the variable resistance film 22. The memory cells MC are arrayed along the X direction, the Y direction, and the Z direction in a three-dimensional matrix configuration. The variable resistance film 22 and the word line 23 are provided with an interlayer insulating film 24 therebetween, and the interlayer insulating film 24 includes, for example, silicon oxide (SiO).

Next, one or more embodiments of a production method of the storage device according to the first aspect will be described.

FIG. 4A through FIG. 4D, FIG. 5A through FIG. 5D, FIG. 6A through FIG. 6D, FIG. 7A through FIG. 7D, FIG. 8A through FIG. 8D, FIG. 9A through FIG. 9D, and FIG. 10A through FIG. 10D are views showing a production method of the storage device according to the first aspect.

FIG. 4A, FIG. 5A, FIG. 6A, FIG. 7A, FIG. 8A, FIG. 9A, and FIG. 10A show a perspective view, FIG. 4B, FIG. 5B, FIG. 6B, FIG. 7B, FIG. 8B, FIG. 9B, and FIG. 10B show a top view, FIG. 4C, FIG. 5C, FIG. 6C, FIG. 7C, FIG. 8C, FIG. 9C, and FIG. 10C show a sectional view taken along a line A-A', and FIG. 4D, FIG. 5D, FIG. 6D, FIG. 7D, FIG. 8D, FIG. 9D, and FIG. 10D show a sectional view taken along a line B-B'. It is noted that the positions of the line A-A' in the drawings differ between drawings. Additionally, to simplify the drawings, boundary lines between insulating members are not shown.

First, multiple global bit lines 11 are provided so as to extend in the X direction as shown in FIG. 1. Then, silicon members 12, gate insulating films 17, and gate electrodes 16 are formed and are filled with an interlayer insulating film (not shown) therebetween. Thus, a lower structure is formed.

Then, as shown in FIG. 4A through FIG. 4D, interlayer insulating films 31 and wiring films 23z are alternately stacked along the Z direction to form a stacked body 30 (e.g. on the lower structure). The interlayer insulating films 31 include an insulating material, such as silicon oxide. The wiring films 23z include an etchable conductive material, such as tungsten.

Next, as shown in FIG. 5A through FIG. 5D, a mask film 33 is formed by depositing, for example, titanium nitride, on the stacked body 30. The mask film 33 is processed into a line-and-space pattern extending in the Y direction by a lithography method and a reactive ion etching (RIE) method. Anisotropic etching, such as RIE, is performed by using the mask film 33 as a mask, to form multiple trenches 32 that extend in the Y direction in the stacked body 30. The trenches 32 penetrate through the stacked body 30 in the Z direction, for example, thereby dividing the stacked body 30 into multiple portions 30a. The trenches 32 may, but need not completely penetrate through the stacked body 30 so long as lower ends of the trenches 32 penetrate to at least a lower surface of the lowermost wiring film 23z.

The wiring films 23z are thus divided into multiple wiring members 23y that extend in the Y direction. The etched surfaces of the wiring members 23y, which are side surfaces facing in the X direction, include areas to become end surfaces 23c (refer to FIG. 3) in a later processing operation. Insulating members 34 are embedded in the trenches 32 by depositing silicon oxide, for example.

Next, a processing operation as shown in FIG. 6A through FIG. 6D is performed. A line-and-space mask pattern (not shown) extending in the X direction is formed on the insulating members 34 and the mask films 33 on the portions 30a. Then, anisotropic etching, such as RIE, is performed by using the line-and-space mask pattern, which extend in the X direction, and the mask films 33, which form a line-and-space pattern extending in the Y direction, as masks.

Thus, the insulating members 34 are divided along the Y direction, and through holes 35 extending in the Z direction are formed. The through holes 35 have an approximately rectangular parallelepiped shape with a longitudinal direction in the Z direction. The through holes 35 are formed immediately above areas between the silicon members 12 (refer to FIG. 1), which are adjacent to each other in the Y direction. The through holes 35 have side surfaces at which the wiring members 23y are exposed. The through holes may, but need not completely penetrate through the insulating members 34 so long as lower ends of the through holes 35 penetrate to at least lower surfaces of the lowermost wiring members 23y. To simplify the drawing, the mask films 33 are not shown in FIG. 6A. The same applies to subsequent perspective views.

Next, a processing operation as shown in FIG. 7A through FIG. 7D is performed. Isotropic etching, such as wet etching, is performed to recess the wiring members 23y that are exposed at the through holes 35. The etching proceeds in the X direction from the exposed surfaces of the wiring members 23y in the through holes 35 both sides of the wiring members 23y, and then proceeds in the Y direction (see FIG. 7B). Thus, recesses 23x are intermittently formed extending along the Y direction at each side in the X direction of the wiring members 23y. As a result, the wiring members 23y have protrusions 23b at parts that are sandwiched between the recesses 23x in the Y direction and have wiring parts 23a at other parts, which can serve as word lines 23. The length in the Y direction of the recesses 23x, which is formed by the etching toward the +Y direction and the −Y direction, is longer than the length in the Y direction of the through holes 35. That is, the length in the Y direction of the protrusions 23b is shorter than the length in the Y direction of the divided insulating members 34.

Then, as shown in FIG. 8A through FIG. 8D, insulating members 37 are embedded in the recesses 23x and in the through holes 35 by depositing silicon oxide, for example. The portions 30a, the insulating members 34, and the insulating members 37 constitute a stacked body 30b.

Next, a processing operation as shown in FIG. 9A through FIG. 9D is performed. A line-and-space mask pattern (not shown) extending in the X direction is formed on the stacked body 30b. Then, anisotropic etching, such as RIE, is performed by using the line-and-space mask pattern, which extends in the X direction, and the mask films 33, which form the line-and-space pattern extending in the Y direction, as masks. The anisotropic etching generates through holes 38 that have an approximately rectangular parallelepiped shape and that extend in the Z direction, in the stacked body 30b.

The through holes 38 are formed immediately above the silicon members 12 (refer to FIG. 1), that is, formed at areas of the insulating members 34 (refer to FIG. 8A through FIG. 8D), different from the areas at which the through holes (refer to FIG. 6A through FIG. 6D) were formed. The positions of the through holes 38 are the same as those of the previously-formed through holes 35 in the X direction, and the positions of the through holes 38 are different from those of the previously-formed through holes 35 in the Y direction. Forming the through holes 38 removes the insulating members 34 (e.g. approximately the entirety of the insulating members 34). The through holes 38 have bottom openings at which the upper surfaces of the silicon members 12 (refer to FIG. 1) are exposed. The through holes 38 expose the end surfaces 23c of the protrusions 23b of the word lines 23.

Next, a processing operation as shown in FIG. 10A through FIG. 10D is performed. A variable resistance material is deposited to form variable resistance films 22 on inside surfaces of the through holes 38 (surfaces that define the through holes 38) and on the upper surface of the stacked body 30b. The variable resistance films 22 are etched to remove the variable resistance films 22 that are deposited on the upper surfaces of the silicon members 12 within the through holes 38 and on the upper surface of the stacked body 30b. The variable resistance films 22 having a tubular shape remain on the side surfaces of the through holes 38 (e.g. on approximately the entirety of the side surfaces of the through holes 38). Then, a conductive material, such as titanium nitride, tungsten, or polysilicon, is deposited, and this conductive material is removed from the upper surface of the stacked body 30b. Thus, local bit lines 21 are formed within the through holes 38 and are connected to the silicon members 12. Then, the mask films 33 are removed. The mask films 33 may be removed at the same time as the removing of the conductive material, for example.

Consequently, a storage device 1 as shown in FIG. 1 through FIG. 3 is fabricated. The remnants of the interlayer insulating films 31, the remnants of the insulating members 34, and the remnants of the insulating members 37 serve as interlayer insulating films 24.

Next, operations according to the first aspect will be described.

A driving circuit (not shown) of a storage device 1 applies a predetermined first potential to a selected global bit line 11. A selected gate electrode 16 is applied with ON potential to make the TFT 19 enter a conductive state. Thus, the first potential is applied to a selected local bit line 21 through the TFT 19. On the other hand, the drive circuit applies a predetermined second potential to a selected word line 23. Thus, an electric voltage corresponding to a potential difference between the first potential and the second potential is applied to the variable resistance film 22 that is connected between the selected local bit line 21 and the selected word line 23, whereby the resistance condition is changed. As a result, data is written in a memory cell MC. The data written in the memory cell MC can be read out by measuring a resistance value of the variable resistance film 22 by sending an electric current to the variable resistance film 22.

Next, advantageous effects of the first aspect will be described.

The storage device 1 according to the first aspect has the protrusions 23b provided at the word lines 23, of which the end surfaces 23c selectively contact the variable resistance films 22. Thus, compared with a case of providing no protrusions 23b to the word lines 23, a contact area between the word line 23 and the variable resistance film 22 is small. The electric current to be sent to the variable resistance film 22 must pass through the end surface 23c, and therefore, the decreased area of the end surface 23c decreases the cell area and improves current density in the variable resistance film 22. This structure allows reliably varying the resistance condition of the variable resistance film 22 with a small amount of electric power.

The decreased area of the end surface 23c decreases OFF electric current that flows when the variable resistance film 22 is in high resistance state. This structure decreases the amount of current consumption. As described above, the first aspect provides for a storage device having memory cells that are driven with a small electric power.

The cell area may be decreased by thinning the local bit lines 21 or the word lines 23. However, in this case, formation of the local bit lines 21 or the word lines 23 is difficult, and the wiring resistance is increased, whereby the storage device 1 is difficult to drive.

According to the first aspect, the through holes 35 are formed in the processing operation as shown in FIG. 6A through FIG. 6D, and the recesses 23x are formed by recessing the wiring members 23y through the through holes 35 in the processing operation as shown in FIG. 7A through FIG. 7D. This procedure allows streamlined formation of the word lines 23 having a complicated shape.

According to the first aspect, the etching is performed by using the mask film 33 as a mask in the processing operation as shown in FIG. 5A through FIG. 5D to divide the wiring films 23z into the wiring members 23y and form the end surfaces 23c of the word lines 23. The etching is performed by using the mask films 33 as masks in the processing operation as shown in FIG. 6A through FIG. 6D to form the through holes 35. The wiring members 23y are recessed in the processing operation as shown in FIG. 7A through FIG. 7D. Thus, the end surfaces 23c and the through holes 35 are formed by using the same mask films 33 to expose the wiring members 23y at the side surfaces of the through holes 35 in a self-alignment manner.

The etching is performed by using the mask films 33 as masks in the processing operation as shown in FIG. 9A through FIG. 9D to form the through holes 38, and the variable resistance films 22 are formed on the side surfaces of the through holes 38 in the processing operation as shown in FIG. 10A through FIG. 10D. Thus, the end surfaces 23c and the through holes 38 are formed by using the same mask films 33 to expose the end surfaces 23c at the side surfaces of the through holes 38 in a self-alignment manner. As a result, the variable resistance films 22 are made to reliably and selectively contact the end surfaces 23c of the word lines 23.

Second Aspect

Next, a second aspect will be described.

Figure 11:
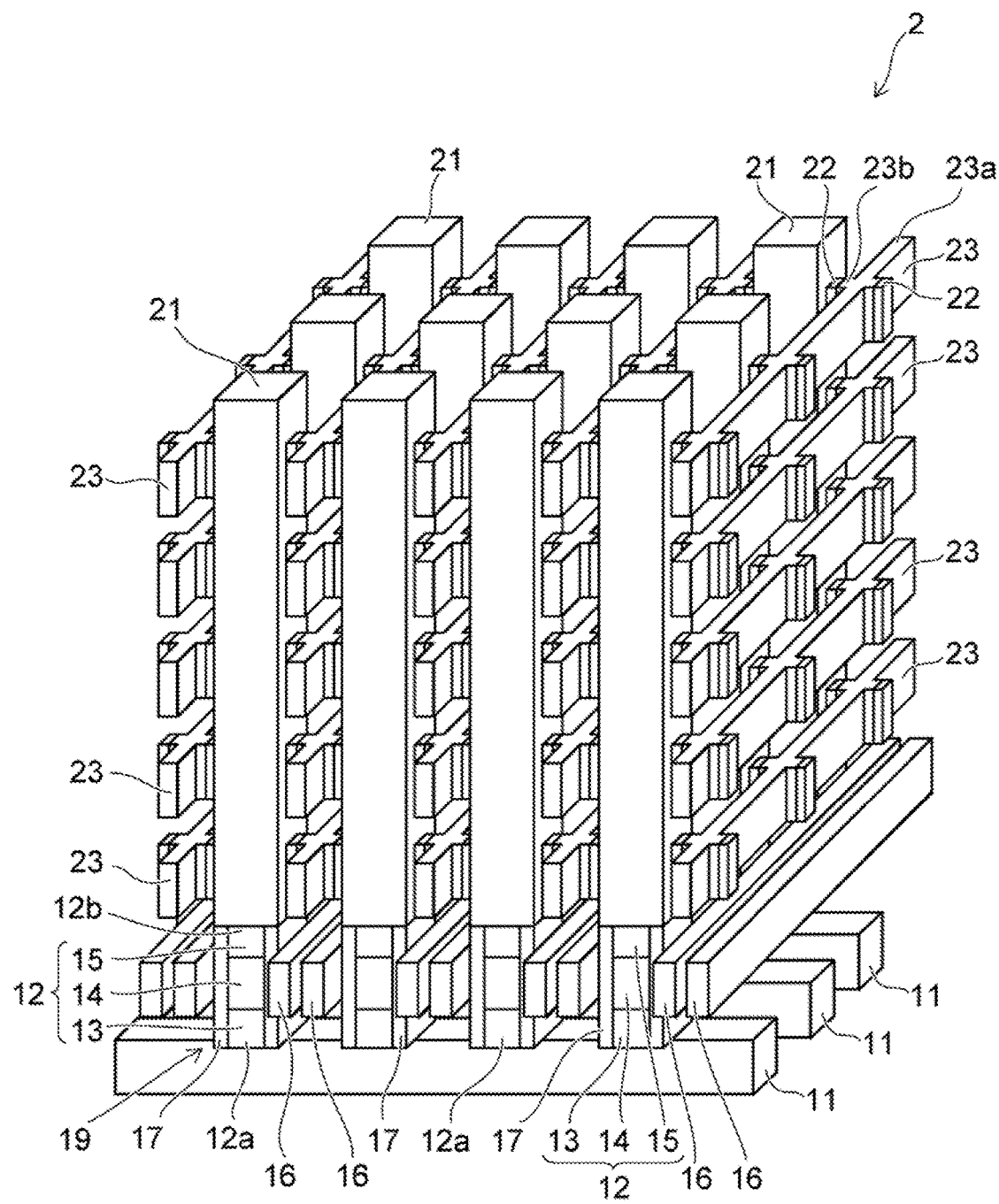
FIG. 11 is a perspective view showing one or more embodiments of a storage device according to a second aspect.

FIG. 11 is a perspective view showing one or more embodiments of a storage device according to the second aspect.

Figure 12:
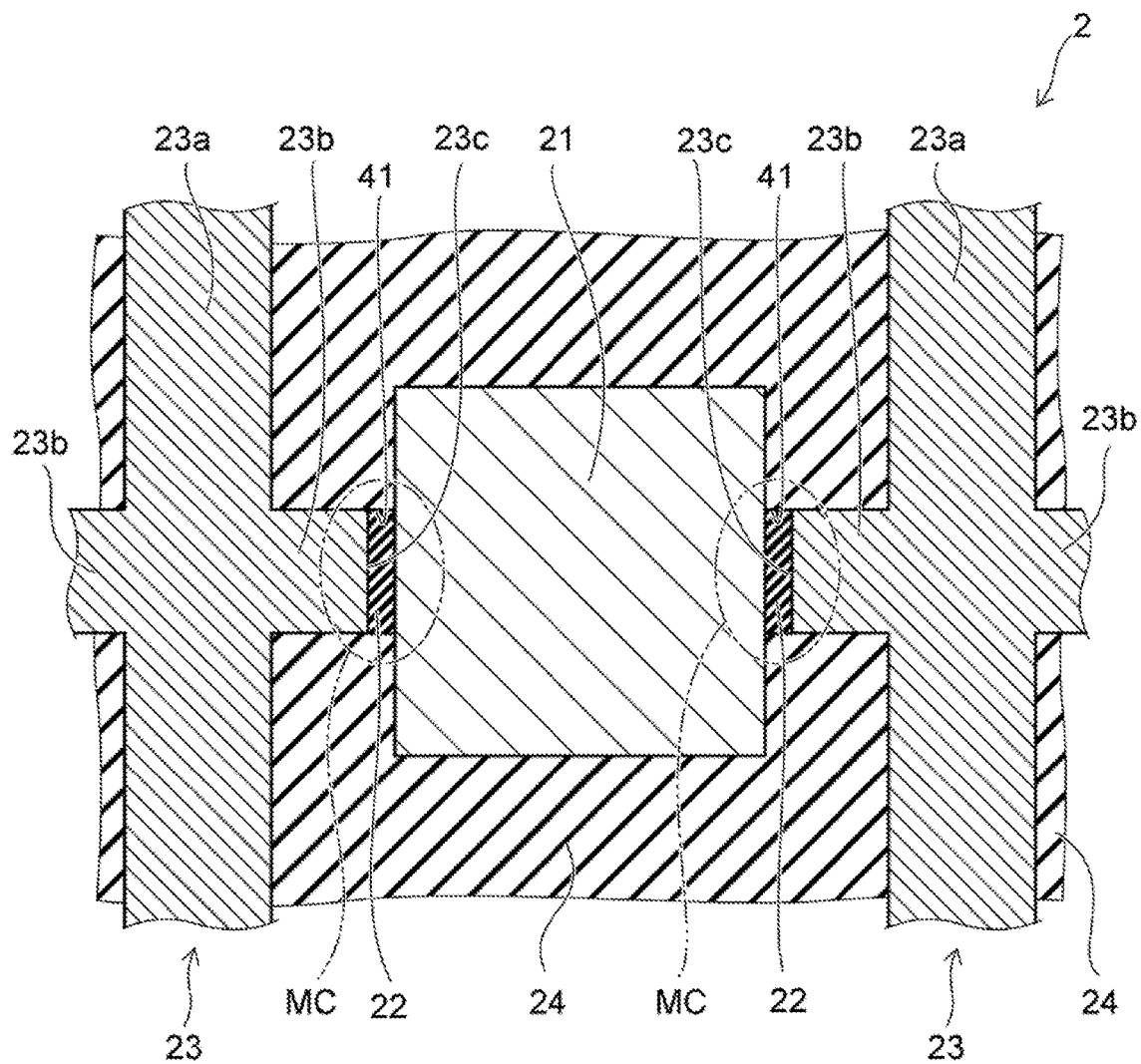
FIG. 12 is a sectional view showing memory cells of one or more embodiments of the storage device according to the second aspect.

FIG. 12 is a sectional view showing memory cells of one or more embodiments of the storage device according to the second aspect.

FIG. 11 and FIG. 12 show a storage device 2 according to the second aspect, which includes variable resistance films 22 at positions that are different from those of the variable resistance films 22 of the storage device 1 (refer to FIG. 1 through FIG. 3) according to the first aspect. The variable resistance films 22 of the storage device 2 are provided between the local bit lines 21 and the end surfaces 23c of the word lines 23 (and are not provided to substantially the entirety of the side surfaces of the local bit lines 21 as in one or more embodiments according to the first aspect, e.g. are selectively provided between the local bit lines 21 and the end surfaces 23c of the word lines 23). Thus, an individual variable resistance film 22 is provided at each intersection between the local bit line 21 and the word line 23, that is, for each memory cell MC.

The variable resistance films 22 have a shape that is approximately the same as the shape of the end surfaces 23c, as seen from the X direction. The variable resistance films 22 have an approximately rectangular parallelepiped shape, and the variable resistance films 22 have a length in the Y direction, which is approximately the same as the length in the Y direction of the end surfaces 23c and have a length in the Z direction, which is approximately the same as the length in the Z direction of the end surfaces 23c.

Next, one or more embodiments of a production method of the storage device according to the second aspect will be described.

FIG. 13A through FIG. 13D are views showing one or more embodiments of a production method of the storage device according to the second aspect.

FIG. 13A is a perspective view, FIG. 13B is a top view, FIG. 13C is a sectional view taken along a line A-A' shown in FIG. 13A and FIG. 13B, and FIG. 13D is a sectional view taken along a line B-B' shown in FIG. 13A and FIG. 13B.

First, the processing operations as shown in FIG. 4A through FIG. 9D are performed in the same or in a similar manner as according to the first aspect.

Then, as shown in FIG. 13A through FIG. 13D, isotropic etching, such as wet etching, is performed to recess exposed parts of the word lines 23 through the through holes 38. Thus, the end surfaces 23c of the word lines 23 are recessed relative to the inside surfaces of the through holes 38, whereby word line recesses are formed.

Then, a variable resistance material is deposited to form variable resistance films 22 on the inside surfaces of the through holes 38 and the upper surface of the stacked body 30b. At this time, the variable resistance films 22 are also formed inside the word line recesses and contact the end surfaces 23c. Then, anisotropic etching, such as RIE, is performed to remove the variable resistance films 22 deposited on the upper surfaces of the silicon members 12 within the through holes 38, on the side surfaces of the through holes 38, and on the upper surface of the stacked body 30b and such that the variable resistance films 22 remain within the recesses 41. Thus, the variable resistance films 22 are individually provided in the word line recesses.

Then, a conductive material, such as titanium nitride, tungsten, or polysilicon, is deposited, and this conductive material is removed from the upper surface of the stacked body 30b. Thus, local bit lines 21 are formed within the through holes 38. The local bit lines 21 contact the variable resistance films 22 and connect to the silicon members (refer to FIG. 1). Then, the mask films 33 are removed. Consequently, the storage device 2 as shown in FIG. 11 and FIG. 12 is fabricated.

Next, advantageous effects of the second aspect will be described.

The second aspect provides for preventing current from leaking between the memory cells MC because the variable resistance films 22 are individually provided for each of the memory cells MC. Thus, generation of erroneous writing in other memory cells MC is prevented when a memory cell MC is driven.

The configuration, the production method, the operation, and the advantageous effects of the second aspect except for the above-described features may be the same as or similar to those according to the first aspect.

The embodiments described above provide for a storage device having memory cells that are driven with a small amount of electric power and provide for a production method of the storage device.

As used herein, the terms "approximately," "about" and "substantially" are used to describe and account for small variations. When used in conjunction with an event or circumstance, the terms "approximately," "about" and "substantially" can refer to instances in which the event or circumstance occurs precisely as well as instances in which the event or circumstance occurs to a close approximation. For example, when used in conjunction with a numerical value, the terms "approximately," "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

While certain embodiments have been described, these embodiments have been presented byway of example only, and are not intended to limit the scope of the present disclosure. Indeed, the embodiments described herein may be embodied in a variety of other forms and can be combined; furthermore, various omissions, substitutions, and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A storage device comprising:
   a first wiring extending in a first direction;
   a pillar connected to the first wiring and extending in a second direction crossing the first direction;
   a second wiring extending in a third direction crossing the second direction, the second wiring comprising a conductive material; and
   a memory cell connected to the pillar and the second wiring, wherein:
   the second wiring comprises:
      a first portion that extends in the third direction, and
      a second portion that protrudes from a first side surface of the first portion toward the pillar,
   an end surface of the second portion is connected to the memory cell,
   the first side surface of the first portion contacts a first insulating film, and
   the first portion of the second wiring and the second portion of the second wiring are integrally formed.

2. The storage device according to claim 1, wherein at least one side surface of the second portion does not contact the memory cell.

3. The storage device according to claim 1, wherein the memory cell comprises a variable resistance film that surrounds the pillar according to a view from the second direction.

4. The storage device according to claim 1, wherein the memory cell comprises a variable resistance film, a total length in the second direction of the variable resistance film is the same as a total length in the second direction of the end surface of the first portion, and a total length in the third direction of the variable resistance film is the same as a total length in the third direction of the end surface of the first portion.

5. The storage device according to claim 1, further comprising:
   a first semiconductor member connected between the first wiring and the pillar;
   a third wiring extending in the third direction; and
   a second insulating film provided between the first semiconductor member and the third wiring.

6. The storage device according to claim 5, further comprising:
   a fourth wiring adjacent to the first wiring in the third direction, the fourth wiring extending in the first direction;
   a fifth wiring connected to the fourth wiring and extending in the second direction; and
   a variable resistance film connected to the fifth wiring and the second wiring,
   wherein the second wiring further includes a third portion that protrudes from the first side surface of the first portion toward the fifth wiring, and an end surface of the first portion is connected to the variable resistance film.

7. The storage device according to claim 6, further comprising:

a second semiconductor member connected between the fourth wiring and the fifth wiring;

a sixth wiring extending in the same direction as the third wiring; and a third insulating film provided between the second semiconductor member and the sixth wiring.

8. The storage device according to claim 7, further comprising:

a seventh wiring connected to the first wiring and extending in the second direction; and a second variable resistance film provided between the seventh wiring and the second wiring, wherein the second wiring further includes a fourth portion that protrudes from a second side surface of the first portion toward the seventh wiring and that has an end surface connected to the second variable resistance film.

9. The storage device according to claim 1, wherein the first side surface of the first portion is in a plane defined by the second direction and the third direction.

10. The storage device according to claim 1, wherein the first portion of the second wiring and the second portion of the second wiring consist of a same material.

11. A storage device comprising:

a first wiring extending in a first direction;

a second wiring connected to the first wiring and extending in a second direction crossing the first direction;

a third wiring having a first surface, a second surface, and a third surface, the third surface provided between the first surface and the second surface, the third wiring extending in a third direction crossing the second direction, the third wiring comprising a conductive material; and a memory cell connected to the second wiring and the third surface of the third wiring, wherein the third surface is projected towards the second wiring in the first direction, relative to the first surface and the second surface, and the first portion of the third wiring and the second portion of the third wiring are integrally formed.

12. The storage device according to claim 11, further comprising:

a fourth wiring adjacent to the second wiring in the third direction, wherein the third wiring has a fourth surface, and the fourth surface is projected towards the fourth wiring in the first direction, relative to the first surface and the second surface.

13. The storage device according to claim 11, wherein the first surface contacts a first insulating film and the second surface contacts a second insulating film.

14. The storage device according to claim 13, wherein the first insulating film is provided between the second wiring and the fourth wiring.

15. The storage device according to claim 11, wherein the first surface and the second surface are in a plane defined by the second direction and the third direction.

* * * * *